US009536955B2

(12) United States Patent
Komiyama et al.

(10) Patent No.: US 9,536,955 B2
(45) Date of Patent: Jan. 3, 2017

(54) NITRIDE SEMICONDUCTOR SUBSTRATE

(71) Applicant: COVALENT MATERIALS CORPORATION, Shinagawa-ku (JP)

(72) Inventors: Jun Komiyama, Hadano (JP); Kenichi Eriguchi, Hadano (JP); Akira Yoshida, Nakano-ku (JP); Hiroshi Oishi, Hadano (JP); Yoshihisa Abe, Hadano (JP); Shunichi Suzuki, Hadano (JP)

(73) Assignee: COORSTEK KK, Tokyo (JP)

( * ) Notice: Subject to any disclaimer, the term of this patent is extended or adjusted under 35 U.S.C. 154(b) by 0 days.

(21) Appl. No.: 14/258,181

(22) Filed: Apr. 22, 2014

(65) Prior Publication Data
US 2014/0319535 A1  Oct. 30, 2014

(30) Foreign Application Priority Data

Apr. 25, 2013  (JP) ................................. 2013-092515

(51) Int. Cl.
H01L 29/205 (2006.01)
H01L 29/20 (2006.01)
(Continued)

(52) U.S. Cl.
CPC ....... *H01L 29/2003* (2013.01); *H01L 21/0254* (2013.01); *H01L 21/0262* (2013.01);
(Continued)

(58) Field of Classification Search
CPC ................... H01L 21/02381; H01L 21/02458; H01L 21/02507; H01L 29/2003; H01L 21/0254; H01L 21/0262; H01L 23/562; H01L 21/02521
(Continued)

(56) References Cited

U.S. PATENT DOCUMENTS 5,882,401 A * 3/1999 Maruyama ............. C30B 29/06
117/106
2006/0191474 A1   8/2006 Chen et al.
(Continued)

FOREIGN PATENT DOCUMENTS

EP     2 565 907 A1    3/2013
JP    H02-197128 A    8/1990
(Continued)

OTHER PUBLICATIONS

Extended European Search Report dated Jun. 27, 2014, issued by the European Patent Office in the corresponding European Application No. 14165376.6. (9 pages).
(Continued)

*Primary Examiner* — Kimberly Rizkallah
*Assistant Examiner* — Brian Turner
(74) *Attorney, Agent, or Firm* — Buchanan, Ingersoll & Rooney PC

(57) ABSTRACT

A nitride semiconductor substrate is provided which is suitable for a high withstand voltage power device and prevents a warp and a crack from generating in a Si substrate when forming a thick nitride semiconductor layer on the substrate. A nitride semiconductor substrate 1 is prepared in such a manner that a buffer layer 3 and a semiconductor active layer 4 each comprising a group 13 nitride are stacked one by one on one principal plane of a Si single crystal substrate, the one principal plane has an offset angle of 0.1° to 1° or −1° to −0.1° with respect to a (111) plane, an average dopant concentration in a bulk is $1 \times 10^{18}$ to $1 \times 10^{21}$ cm$^{-3}$, the Si single crystal substrate 2 has a SiO$_2$ film on the back, and the total thickness of the buffer layer 3 and the semiconductor active layer 4 is 4 to 10 μm.

2 Claims, 1 Drawing Sheet

(51) Int. Cl.
  *H01L 29/167* (2006.01)
  *H01L 29/165* (2006.01)
  *H01L 21/02* (2006.01)
  *H01L 29/04* (2006.01)
  *H01L 29/778* (2006.01)

(52) U.S. Cl.
  CPC .. *H01L 21/02381* (2013.01); *H01L 21/02433* (2013.01); *H01L 21/02458* (2013.01); *H01L 21/02658* (2013.01); *H01L 29/045* (2013.01); *H01L 29/7786* (2013.01)

(58) Field of Classification Search
  USPC ............. 257/76, 77, 201, 615; 438/478
  See application file for complete search history.

(56) References Cited

U.S. PATENT DOCUMENTS

| | | | |
|---|---|---|---|
| 2008/0087967 A1* | 4/2008 | Kim | 257/369 |
| 2008/0160647 A1 | 7/2008 | Anderson | |
| 2009/0246944 A1* | 10/2009 | Keller et al. | 438/478 |
| 2012/0032229 A1* | 2/2012 | Deai et al. | 257/190 |
| 2012/0223328 A1* | 9/2012 | Ikuta et al. | 257/76 |
| 2014/0103353 A1* | 4/2014 | Ishibashi | H01L 21/2007 257/76 |

FOREIGN PATENT DOCUMENTS

| | | |
|---|---|---|
| JP | 08-111409 | 4/1996 |
| JP | 2003-059948 A | 2/2003 |
| JP | 2003-86837 A | 3/2003 |
| JP | 2010-016366 | 1/2010 |
| JP | 2010-153817 A | 7/2010 |
| JP | 2010-272781 | 12/2010 |
| JP | 2011-119715 | 6/2011 |
| JP | 2011-165962 A | 8/2011 |
| JP | 2012-015304 A | 1/2012 |
| JP | 2012-051774 | 3/2012 |
| JP | 2012-186268 | 9/2012 |

OTHER PUBLICATIONS

Tanaka et al., "Defect Structure in Selective Area Growth GaN Pyramid on (111) Si Substrate", Applied Physics Letters, May 8, 2000, vol. 76, No. 19, pp. 2701-2703.

Schenk et al., "Growth of Thick, Continuous GaN Layers on 4-in. Si Substrates by Metalorganic Chemical Vapor Deposition", Journal of Crystal Growth, Jan. 1, 2011, vol. 314, No. 1, pp. 85-91.

Office Action issued in corresponding Japanese patent application on Dec. 1, 2014 (4 pages).

* cited by examiner

NITRIDE SEMICONDUCTOR SUBSTRATE

BACKGROUND OF THE INVENTION

1. Field of the Invention

The present invention relates to a nitride semiconductor substrate comprising a group 13 nitride and used suitably for a semiconductor power device which withstands a high voltage.

2. Description of the Related Art

Group 13 nitride semiconductors including GaN attract attention as next-generation semiconductor power device materials. In particular, a nitride semiconductor substrate having grown group 13 nitride semiconductor crystal epitaxially on a substrate of different materials, such as sapphire, silicon, etc., has many advantages in respect of the balance between a device property and manufacturing cost. Especially, one that uses a Si single crystal substrate which allows a diameter of 6 inches is very useful industrially.

However, since a nitride semiconductor has a thermal expansion coefficient larger than that of a Si single crystal, a nitride semiconductor layer epitaxially grown on a Si single crystal substrate at a high temperature may generate a crack, a crystal defect due to difference in crystal-lattice constant from Si when it is cooled to room temperature.

To cope with this, improvements have occurred, such as using a highly concentrated doped Si substrate when depositing a nitride semiconductor layer, preparing a buffer layer on the Si substrate, etc. Further, in order to form a good buffer layer, Japanese Patent Application Publication No. 2003-59948 (Patent Literature 1), for example, has proposed a plane direction is arranged such that the principal plane of the Si single crystal substrate on which a buffer layer is deposited is flush with a (111) plane or inclined at an angle in the range of ±4° to the (111) plane.

Furthermore, Japanese Patent Application Publication No. 2012-15304 (Patent Literature 2) discloses that, in contact with the principal plane of the Si substrate whose principal plane is a plane inclined at an offset angle of 0.1° or less to the (111) plane, an AlN layer whose half-value width of a rocking curve by X-ray diffraction at (002) plane is 2000 sec or less is prepared, on which a GaN type semiconductor layer is provided, whereby crystallinity of the nitride semiconductor can be improved and the property of the semiconductor device can also be improved.

As described in Patent Literature 2 above, it is known that the offset angle of the Si substrate principal plane influences the crystallinity and evenness of the nitride semiconductor layer which is deposited and formed on the principal plane. Further, Patent Literature 1 above discloses that the plane direction of the Si single crystal substrate and inclination (offset angle) are specified for the purpose of reducing atomic steps on a crystal surface of the buffer layer and a semiconductor region, thus some steps are less problematic in the case where an epitaxial growth layer is comparatively thick, Incidentally, in recent years, power devices, such as a high-electron mobility transistor (HEMI) element, have been requiring a high withstand voltage, so as to bear even a voltage exceeding 600V. In such a high withstand voltage device, the nitride layer requires the total thickness of greater than 4 µm.

Therefore, in such a thick nitride layer, in order to attain reduction (i.e., improvement in evenness) of the step of the nitride layer surface, it is thought that it is not necessary to employ the Si single crystal substrate with a plane direction in which an offset angle is comparatively small as described above in Patent Literatures 1 and 2.

However, when the nitride layer is thickened as described above, there arises a problem in that the cracks and warp are generated in the nitride semiconductor substrate in the case of epitaxial growth. In particular, the diameter of the substrate has been enlarged for improving the manufacture efficiency in recent years, 6 inch substrates have been manufactured, and it becomes progressively more difficult to control the warp in such a large diameter substrate.

Such problems are conventionally addressed by reducing stress by means of a multilayered buffer layer, by a method of restricting dislocation generation, or by a method of controlling the warp of the whole substrate by controlling impurity concentration of the Si single crystal substrate of a base. However, even in the case where such technology is applied, it is very difficult to restrict the warp in the large diameter substrate.

Then, the present inventors have diligently repeated various examinations of the substrates having the above-described thick buffer layer for high withstand voltage power devices. Thus, we have found that the warp of the nitride semiconductor substrate and generation of cracks can be controlled effectively, while maintaining good crystallinity, by a suitable combination of a specific underside form, a bulk property, and a surface offset angle in the Si single crystal substrate.

SUMMARY OF THE INVENTION

The present invention arises based on the above-mentioned findings and aims to provide a nitride semiconductor substrate in which generation of warp and cracks in a substrate is restricted when forming a thick nitride semiconductor layer on a Si substrate and which is suitable for a high withstand voltage power device.

The nitride semiconductor substrate in accordance with the present invention is a nitride semiconductor substrate in which a buffer layer and a semiconductor active layer each comprising a group 13 nitride are stacked one by one on one principal plane of a Si single crystal substrate, wherein the one principal plane has an offset angle of 0.1° to 1° or −1° to −0.1° with respect to a (111) plane, an average dopant concentration in a bulk is $1 \times 10^{18}$ to $1 \times 10^{-21}$ cm$^{-3}$, the above-mentioned Si single crystal substrate has a SiO$_2$ film on the back, and the total thickness of the above-mentioned buffer layer and the above-mentioned semiconductor active layer is 4 to 10 µm.

In the case where the nitride layer is a thick film, generation of the warp and cracks in the substrate can be controlled by depositing and forming it on the one principal plane of the Si single crystal substrate which has such a predetermined plane direction.

In the above-mentioned nitride semiconductor substrate, it is preferable that the above-mentioned dopant is boron.

Further, it is preferable that the above-mentioned SiO$_2$ film is formed at a growth temperature of 400° C. to 600° C. and has a thickness of 10 to 1000 nm.

With such a structure, it is possible to further improve the effect of controlling the warp.

According to the present invention, it is possible to obtain the nitride semiconductor substrate in which the generation of warp and cracks of the substrate are controlled at the time of forming the thick nitride semiconductor layer on the Si substrate. Therefore, the nitride semiconductor substrate in accordance with the present invention can be suitably used as a substrate for a high withstand voltage power device.

DESCRIPTION OF THE PREFERRED EMBODIMENTS

Hereinafter, the present invention will be described in detail with reference to the drawings.

Figure 1:
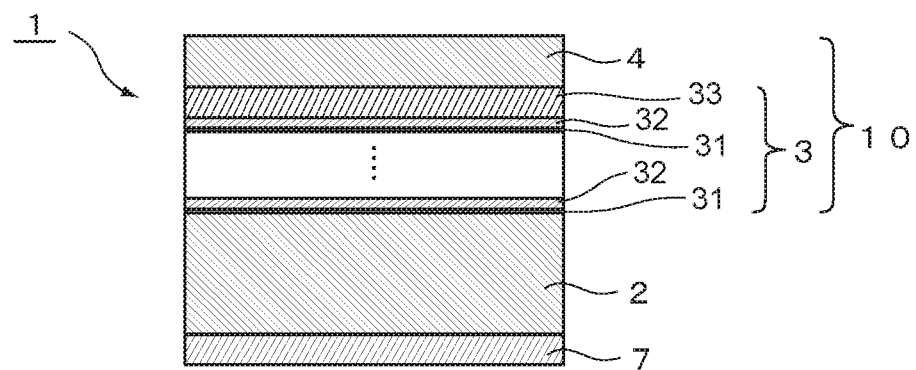
FIG. 1 is a schematic sectional view showing a layer structure of a nitride semiconductor substrate in accordance with the present invention.

A nitride semiconductor substrate in accordance with the present invention is schematically shown in FIG. 1. The nitride semiconductor substrate 1 shown in FIG. 1 has a structure in which a buffer layer 3 and a semiconductor active layer 4 are stacked one by one on one principal plane of a Si single crystal substrate 2. The buffer layer 3 and the semiconductor active layer 4 each comprise a group 13 nitride. Further, the above-mentioned one principal plane has an offset angle (0.1° to 1° or −1° to −0.1°) with respect to a (111) plane, an average dopant concentration in a bulk is $1\times10^{18}$ to $1\times10^{21}$ cm$^{-3}$, and the Si single crystal substrate 2 has a SiO$_2$ film 7 on the back. The buffer layer 3 has a structure including a composite layer in which group 13 nitrides having mutually different lattice constants, for example, are stacked by turns. Further, the total thickness of the buffer layer 3 and the semiconductor active layer 4, which constitute a nitride layer 10, is 4 to 10 μm.

Figure 2:
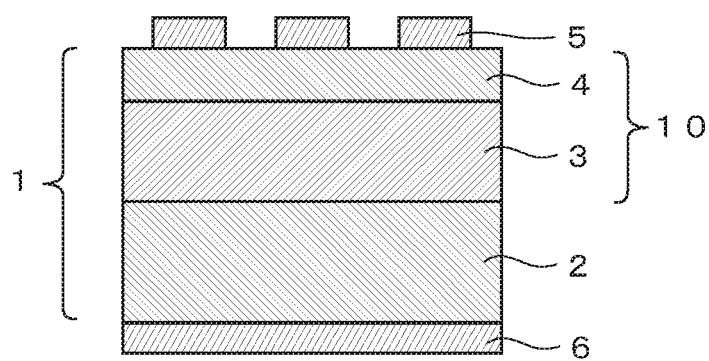
FIG. 2 is a schematic sectional view showing a layer structure of an example of an electron device using the nitride semiconductor substrate in accordance with the present invention.

FIG. 2 schematically illustrates an example of the electron device using the nitride semiconductor substrate shown in FIG. 1. In the electron device shown in FIG. 2, according to the purpose and the use of the device, electrodes 5 and 6 are formed respectively on an upper surface and an under surface of the nitride semiconductor substrate 1. It should be noted that the SiO$_2$ film 7 formed on the back of the Si single crystal substrate 2 is removed when forming the electrodes.

As described above, in the nitride semiconductor substrate 1 in accordance with the present invention, the nitride layer 10 having the total thickness of 4 to 10 μm is formed on the one principal plane of the Si single crystal substrate 2 which has a predetermined offset angle and the average dopant concentration in the bulk and has the SiO$_2$ film on the back.

As such, the nitride semiconductor substrate 1 in accordance with the present invention is mainly characterized by the structure of the Si single crystal substrate 2 used as a base material. Thus, the Si single crystal substrate 2 itself can substantially secure the warp control of the nitride semiconductor substrate 1 and can cope with an enlarged substrate simply and appropriately.

It is thought that the offset angle of the one principal plane of Si single crystal substrate 2 mainly affects the evenness and crystallinity of the buffer layer 3 and the semiconductor active layer 4 of the nitride layer 10, the dopant concentration in the bulk influences the warp of the substrate, and the back film influences the purity and crystallinity of the above-mentioned nitride layer.

The mechanism of the interaction of three factors of the offset angle, the dopant concentration in the bulk, and the back film may not be clear, but by allowing these to meet predetermined conditions, the present invention makes it possible to control the warp, while maintaining the crystallinity and evenness of the nitride layer in the nitride semiconductor substrate.

Herein, by "group 13 nitride", we particularly mean boron nitride, aluminum nitride, gallium nitride, indium nitride, or thallium nitride. It is not restricted to the nitride of one element and may be a mixed nitride which contains two or more elements. As typical examples, there may be mentioned AlN, GaN, AlGaN, etc. and a ratio of the respective components can be varied.

It is preferable that the buffer layer 3 comprising the above-mentioned group 13 nitride includes the composite layer in which the group 13 nitrides having mutually different lattice constants are stacked by turns. In particular, as examples of the structures of the above-mentioned composite layer, there may be mentioned ones, but not limited to, in which a pair of an AlN layer and a GaN layer are repeatedly stacked, an AlGaN layer is inserted between the pairs of stacked layers, etc.

Such a composite layer serves to control a crystal defect caused by dislocation etc. of the semiconductor active layer formed on the Si single crystal substrate.

In the present invention, it is assumed that the one principal plane of the Si single crystal substrate 2 on which the nitride layer 10 is deposited and formed is a plane whose offset angle with respect to a (111) plane is 0.1° to 1° or −1° to −0.1°.

Since such an offset angle is provided for the one principal plane of the Si single crystal substrate 2, the regularity of steps is secured and it is possible to form the nitride layer 10 having good evenness, compared with the case where an offset angle is not provided. On the other hand, if the offset angle is too large, a big step level difference affects and spoils the evenness of the nitride layer 10.

Further, the minute offset angle as described above causes the stress propagation to the nitride layer 10 deposited one by one, which is subtly different from that caused by a large offset angle or zero offset angle, and it is thought that the warp of the whole substrate is controlled by the interaction with the stress distribution of the comparatively thick nitride layer 10 having a thickness of 4 μm or more.

If an absolute value of the offset angle with respect to the (111) plane is larger than 1°, a stress relaxation effect in the buffer layer decreases due to poor evenness of the buffer layer 3 influenced by the step level difference. As a result, it becomes difficult to fully control the warp. On the other hand, in the case where the absolute value of the offset angle is smaller than 0.1° or the substrate is flush with the (111) plane, the regularity of the steps is not fully obtained especially when forming the thick nitride layer 10, thus leading to a possibility of poor evenness.

It is preferable that the absolute value of the above-mentioned offset angle is 0.2° to 0.8°.

Further, the average dopant concentration in the bulk of the Si single crystal substrate 2 is $1\times10^{18}$ to $1\times10^{21}$ cm$^{-3}$.

By increasing the average dopant concentration in the bulk of the Si single crystal substrate 2, the strength of the Si single crystal substrate 2 can be improved, and the warp of the whole nitride semiconductor substrate 1 can be controlled.

Furthermore, in the case of a high dopant concentration, a surface state of a step terrace of the Si single crystal substrate 2 having a minute offset angle is different from that at a low dopant concentration because of the influence of distortion caused by ingress of dopant between grids. It is thought that this different surface state prevents the crystallinity of the nitride layer 10 having a thickness of 4 μm or more from deteriorating under the high stress.

It should be noted that the above-mentioned average dopant concentration in the bulk can be found as an average of values obtained by measuring surface portions, for example, at a central point on the one principal plane of the Si single crystal substrate 2 and one point on the perimeter by way of the secondary ion mass spectrometry (SIMS method). Of course, it is possible to employ an average of the values obtained by measuring multiple points.

The above-mentioned average dopant concentration of less than $1 \times 10^{18}$ cm$^{-3}$ cannot maintain the sufficient strength. On the other hand, in the case of $1 \times 10^{21}$ cm$^{-3}$ or more, there is a possibility that crystal distortions may increase because of the excessive dopants, and the substrate may become weak.

It is preferable that the above-mentioned average dopant concentration is $5 \times 10^{18}$ to $1 \times 10^{20}$ cm$^3$.

It should be noted that as the above-mentioned dopant, various types of dopants corresponding to n-type and p-type are applicable. For example, although there may be mentioned boron, arsenic, phosphorus, antimony, etc., boron is particularly preferred in view of excellent strength and matching with the nitride layer.

Further, the Si single crystal substrate 2 has the SiO$_2$ film 7 on the back.

By forming the SiO$_2$ film 7 on the back which is a face opposite the one principal plane where the nitride layer of the Si single crystal substrate 2 is formed, autodoping of the group 13 nitride from the nitride layer 10 to the Si single crystal substrate 2 is controlled. Further, Si atoms and the dopant can be prevented from externally diffusing from the back of the Si single crystal substrate 2 and the nitride layer 10 can be prevented from being autodoped. Thus, the good crystallinity of the nitride layer 10 is held synergistically with the action by the above-mentioned minute offset angle, and the influence of foreign element contamination can be controlled.

Furthermore, although not significant, it is assumed that this SiO$_2$ film 7 serves to relax the stress in a situation where the nitride layer 10 with a thickness of 4 μm or more is deposited.

It is preferable that the above-mentioned SiO$_2$ film 7 is formed at a growth temperature of 400° C. to 600° C., for example, by the normal pressure CVD method.

The SiO$_2$ film 7 formed by such a method has an advantage that it is excellent in removal in a later process, while keeping precision suitable for maintaining the protection capability with respect to autodoping. It should be noted that if it is possible to form a film which can readily be removed, even other methods, such as a thermal oxidation method, a spin coat method, etc. may be employed.

As described above, since the above-mentioned SiO$_2$ film 7 functions as a protective film for controlling autodoping, it requires at least a thickness of 10 nm. However, if it is greater than 1000 nm, there is a possibility of generating dust due to debris from the film, which is not preferred.

More preferably, a thickness of the above-mentioned SiO$_2$ film 7 is 100 to 700 nm, still more preferably 300 to 600 nm.

It should be noted that this SiO$_2$ film may be removed in a later process after forming the semiconductor active layer 4, if necessary. Etching by means of an acid solution containing hydrogen fluoride is suitable for the removal method.

Further, in consideration of a thickness etc. of the nitride layer 10 deposited and formed in order to attain a high withstand voltage, it is preferable that a thickness of the Si single crystal substrate 2 is 600 to 1000 μm in terms of controlling the generation of the warp or cracks in the substrate.

It should be noted that the method of manufacturing the Si single crystal substrate 2 is not particularly limited. It may be manufactured by the Czochralski (CZ) method, or may be manufactured by the floating zone (FZ) method. Further, a Si single crystal layer may be epitaxially grown on these Si single crystal substrates by the vapor deposition method (Si epitaxial substrate).

If a nitride semiconductor is grown epitaxially and the nitride semiconductor substrate is prepared on the Si single crystal substrate, it is possible to employ equipment and technology which are used in the conventional Si semiconductor manufacturing process, and to enlarge a diameter and reduce the costs, thus being advantageous in respect of manufacture efficiency.

As for the nitride semiconductor substrate 1 in accordance with the present invention, in order to obtain power devices, such as HEMI, especially a device with a high withstand voltage which can withstand a voltage of greater than 600V, the total thickness of at least 4 μm is required for the nitride layer 10 constituted by the buffer layer 3 and the semiconductor active layer 4. Usually, it is formed to have a thickness of 4 to 10 μm.

When the total thickness of the nitride layer 10 is greater than 10 μm, the stress is very large and it is difficult to maintain the controllability of the stress. Preferably, the above-mentioned thickness is 4 to 6 μm. For example, when obtaining a withstand voltage of 600 to 800V for a 6-inch Si single crystal substrate, more preferably it is formed to have a thickness of 4.5 to 5.5 μm in terms of the balance between the withstand voltage and the stress controllability.

The above-mentioned semiconductor active layer 4 is not particularly limited in the present invention, and it is possible to employ a structure that includes other layers, such as an electron transit layer, an electron supply layer, as well as a modulation dope layer, a spacer layer, etc. Further, according to the purpose and the use when producing the devices, it is possible to form other layers, such as a cap layer, a passivation layer, etc., on the semiconductor active layer 4.

Although each layer of the nitride semiconductor substrate 1 is usually deposited and formed by the epitaxial growth, it is not particularly limited, and conventionally used methods may be employed. For example, it is possible to use the CVD methods including MOCVD (Metal Organic Chemical Vapor Deposition) and PECVD (Plasma Enhanced Chemical Vapor Deposition), a deposition method using a laser beam, a sputtering method using atmosphere gas, MBE (Molecular Beam Epitaxy) using a molecular beam in a high vacuum, and MOMBE (Metal Organic Molecular Beam Epitaxy) which combines MOCVD and MBE. Further, the materials used when epitaxially growing the layers are not limited to those used in the following Examples, either. For instance, the source gases for causing the layer to contain carbon may be acetylene, ethane, propane, trimethyl aluminum, and trimethyl gallium in addition to methane.

Furthermore, forming and processing the electrodes when producing the nitride semiconductor device by using such a nitride semiconductor substrate in accordance with the present invention are not particularly limited, but can be performed by conventional methods. For example, by way of vacuum deposition or lithography, it is possible to form the electrodes on the surface and the back of the above-mentioned substrate using a known material.

EXAMPLES

Hereinafter, the present invention will be described more particularly with reference to Examples, but the present invention is not limited thereto.

Experiment 1

Offset Angle (1) Production of Nitride Semiconductor Substrate

In a nitride semiconductor substrate 1 having a layer structure as shown in FIG. 1, a substrate in which an offset angle with respect to (111) plane of one principal plane of a Si single crystal substrate 2 was set for each Sample as shown in the following Table 1 was produced according to the following processes.

First, the Si single crystal substrate 2 was prepared having a diameter of 6 inches, a thickness of 675 μm, a boron concentration of $1 \times 10^{19}$ cm$^{-3}$, and a predetermined offset angle with respect to the (111) plane as shown in the following Table 1, and a SiO$_2$ film with a thickness of 500 nm was formed on the back at a growth temperature of 450° C. by the normal pressure CVD method.

This Si single crystal substrate 2 was placed in an MOCVD apparatus, and heat-treated at 1000° C. in a hydrogen gas atmosphere. Then, an AlN single crystal layer 31 with a thickness of 20 nm was formed by vapor deposition at 1000° C., using trimethyl aluminum (TMA) and ammonia (NH$_3$) as source gases. Further, a GaN single crystal layer 32 with a thickness of 80 nm was stacked on the AlN crystal layer 31 using trimethyl gallium (TMG), TMA gas, and NH$_3$ gas as the source gases by way of vapor deposition at 1000° C. A pair of the AlN single crystal layer 31 and the GaN single crystal layer 32 were stacked and the same process was alternately repeated so that a composite layer in which 10 pairs, i.e. 20 layers in total were stacked was formed. Furthermore, a GaN layer 33 with a thickness of 500 nm was formed on the composite layer to form a buffer layer 3 having a multilayer structure.

Then, an electron transit layer of GaN having a thickness of 3000 nm was stacked on this buffer layer 3 by vapor deposition at 1000° C. using TMG gas and NH$_3$ gas as the source gases. Furthermore, using TMG gas, TMA gas, and NH$_3$ gas, an electron supply layer of Al$_{0.25}$Ga$_{0.75}$N single crystal having a thickness of 30 nm was stacked by vapor deposition at 1000° C. to form a semiconductor active layer 4 and obtain the nitride semiconductor substrate 1.

It should be noted that adjustment of the thickness of each layer formed by the vapor deposition was carried out by adjusting a gas flow rate and supply time.

(2) Evaluation of Nitride Semiconductor Substrate

Various evaluations shown below were carried out on each nitride semiconductor substrate produced as described above.

Generation of warp and a crack (except for the substrate perimeter) was evaluated by means of a laser displacement meter and a dark field image of an optical microscope. It should be noted that, a distance of the warp was found as a difference between the maximum and minimum distances by which the back of the substrate before epitaxial growth moved in its thickness direction. A warp distance of 50 μm or less was determined as "excellent"; one that was between 50 μm and 80 (inclusive) μm was determined as "good"; one that was greater than 80 μm determined as "poor".

Further, crystalline evaluation was carried out by a measured value of a diffraction half-value width of a GaN (002) plane, the measurement was performed by an X-ray diffraction method. A value of 0.20 deg. or less was determined as "good"; one that was greater than 0.20 deg. was determined as "poor".

(3) Production and Evaluation of HEMI Element

Further, the electron device having a layer structure as shown in FIG. 2 was produced using each nitride semiconductor substrate produced as described above.

In particular, after removing the SiO$_2$ film 7 on the back of the nitride semiconductor substrate 1, a groove between a recess gate region and an element separation region was formed by dry etching, a Pd/Ti/Au electrode as a gate electrode and Ti/Al/Ni/Au electrodes 5 as a source and a drain electrode were respectively formed on the semiconductor active layer 4 side, and an Al electrode was formed as a back electrode 6 by vacuum deposition, thus producing a HEMT element.

A withstand voltage of each of the thus obtained HEMT elements was measured using a curve tracer. A withstand voltage of 600V or more was determined as "good"; one that was less than 600V was determined as "poor". It should be noted that in each element sample, the conditions other than those listed in Table were the same as those for Sample 1.

These evaluation results are collectively shown in Table 1.

TABLE 1

| Sample No. | Offset angle | Warp | Generation of crack | Withstand voltage | Crystallinity |
|---|---|---|---|---|---|
| 1 | 0.5° | Excellent (45 μm) | None | Good | Good (0.15 deg.) |
| 2 | 0° | Good | None | Good | Poor |
| 3 | 0.1° | Good (70 μm) | None | Good | Good |
| 4 | 0.2° | Excellent (50 μm) | None | Good | Good |
| 5 | 0.6° | Excellent (45 μm) | None | Good | Good |
| 6 | 0.8° | Good (60 μm) | None | Good | Good |
| 7 | 1° | Good (80 μm) | None | Good | Good |
| 8 | 2° | Poor (>100 μm) | Observed | — | — |

As can be seen from the evaluation results shown in Table 1, the warp was controlled and the generation of a crack was not observed in the nitride semiconductor substrates (Samples 1, 3 to 7) using the Si single crystal substrate whose offset angle with respect to (111) plane was 0.1° to 1°. Further, it is confirmed that the HEMT element having a withstand voltage of greater than 600V can be obtained. It is confirmed that especially when an offset angle is 0.2° to 0.8° (Samples 1, 4 to 6), the warp is 60 μm or less and therefore more controlled, and when the offset angles are 0.5° and 0.6° (Samples 1 and 5), the warp is 50 μm or less and therefore still more controlled.

On the other hand, when the offset angle is 0° (Sample 2), the regularity of a step is low and crystallinity is inferior to those of other Samples. Further, when the offset angle is greater than 1° (Sample 8), the warp of the substrate exceeds 100 μm, a crack is generated, and it is difficult to produce a HEMT element.

Experiment 2

Dopant Concentration

A boron concentration of the Si single crystal substrate 2 was changed to each concentration shown in the following Table 2 on the basis of the above-mentioned Sample 1. The other conditions were similar to those in Experiment 1; each nitride semiconductor substrate was produced and used to produce the HEMT element which was evaluated.

These evaluation results are collectively shown in Table 2.

TABLE 2

| Sample No. | Boron concentration (cm$^{-3}$) | Warp | Generation of crack | Withstand voltage | Crystallinity |
|---|---|---|---|---|---|
| 1 | $1 \times 10^{19}$ | Excellent (45 μm) | None | Good | Good (0.15 deg.) |
| 9 | $5 \times 10^{17}$ | Poor (100 μm) | None | Good | Good |
| 10 | $5 \times 10^{18}$ | Excellent (45 μm) | None | Good | Good |
| 11 | $1 \times 10^{20}$ | Excellent (50 μm) | None | Good | Good |
| 12 | $1 \times 10^{21}$ | Good (65 μm) | None | Good | Good |
| 13 | $2 \times 10^{21}$ | Excellent | Observed | — | — |

As can be seen from the evaluation results shown in Table 2, when a boron concentration was $1 \times 10^{18}$ to $1 \times 10^{21}$ cm$^3$ (Samples 1, 10 to 12), the generation of warp and crack was controlled. No generation of cracks was observed at the Si single crystal substrate 2 itself, either. Especially when a boron concentration was $5 \times 10^{18}$ to $1 \times 10^{20}$ cm$^{-3}$ (Samples 1, 10, and 11), it was confirmed that the warp was 50 μm or less and therefore more controlled.

It should be noted that when a boron concentration was greater than $1 \times 10^{21}$ cm$^{-3}$ (Sample 13), cracks were generated and it was difficult to produce a HEMT element.

Experiment 3

Underside SiO$_2$ Film

On the basis of the above-mentioned Sample 1, a film thickness of each SiO$_2$ film formed on the back of the Si single crystal substrate 2 was varied as shown in the following Table 3. The other conditions were similar to those in Experiment 1; each nitride semiconductor substrate was produced and used to produce the HEMT element which was evaluated.

These evaluation results are collectively shown in Table 3.

TABLE 3

| Sample No. | Film thickness (nm) | Warp | Generation of crack | Withstand voltage | Crystallinity |
|---|---|---|---|---|---|
| 1 | 500 | Excellent (45 μm) | None | Good | Good (0.15 deg.) |
| 14 | 5 | Good | None | Good | Poor |
| 15 | 10 | Good (70 μm) | None | Good | Good (0.18 deg.) |
| 16 | 100 | Good (70 μm) | None | Good | Good (0.18 deg.) |
| 17 | 300 | Excellent (50 μm) | None | Good | Good (0.15 deg.) |
| 18 | 600 | Good (60 μm) | None | Good | Good (0.15 deg.) |
| 19 | 700 | Good (70 μm) | None | Good | Good (0.14 deg.) |
| 20 | 1000 | Good (80 μm) | None | Good | Good (0.14 deg.) |
| 21 | 1500 | Good | None | Good | Good |

As can be seen from the evaluation results shown in Table 3, when the SiO$_2$ films having a thickness of from 10 to 1000 nm were formed (Samples 1, 15 to 20), it was confirmed that the warp was controlled in each substrate, while maintaining good crystallinity. Especially when a thickness of the SiO$_2$ film was 100 to 700 nm (Samples 1, 16 to 19), the warp was more controlled without spoiling the withstand voltage of the HEMT element. When a thickness of the SiO$_2$ film was 300 to 600 nm (Samples 1, 17, and 18), it was confirmed that warp was further controlled to be 60 μm or less.

It should be noted that when a thickness of the SiO$_2$ film was greater than 1000 nm (Sample 21), dusts were observed due to debris from the back of the SiO$_2$ film, which was not suitable for the manufacture process of a HEMT element.

Experiment 4

Thickness of Nitride Layer

On the basis of Sample 1 above, the total thickness of the nitride layer (the buffer layer 3 and semiconductor active layer 4) was varied as shown in the following Table 4 by varying a film thickness of the GaN layer (electron transit layer). The other conditions were similar to those in Experiment 1; each nitride semiconductor substrate was produced and used to produce the HEMT element which was evaluated.

It should be noted that since film formation by the MOCVD method took a longtime in the case of a thickness of 8 μm or more, generation of warp and a crack was evaluated by the numerical calculation simulation of stress.

These evaluation results are collectively shown in Table 4.

TABLE 4

| Sample No. | Thickness of nitride layer (μm) | Warp | Generation of crack | Withstand voltage | Crystallinity |
|---|---|---|---|---|---|
| 1 | 4.5 | Excellent (45 μm) | None | Good | Good (0.15 deg.) |
| 22 | 3.5 | Good | None | Poor (550 V) | Good |
| 23 | 4 | Excellent (50 μm) | None | Good | Good (0.16 deg.) |
| 24 | 5.5 | Excellent (48 μm) | None | Good | Good (0.14 deg.) |
| 25 | 6 | Good (60 μm) | None | Good | Good |
| 26 | 8 | Good (75 μm) | None | Good | Good |
| 27 | 10 | Good (80 μm) | None | Good | Good |
| 28 | 11 | Poor | Observed | — | — |

As can be seen from the evaluation results shown in Table 4, when a thickness of the nitride layer was 4 to 10 μm (Samples 1, 23 to 27), it was confirmed that the warp was controlled in each substrate, while maintaining good crystallinity. Especially when a thickness was 4 to 6 μm (Samples 1, 23 to 25), the warp was more controlled to be 60 μm or less. When a thickness was 4.5 to 5.5 μm (Samples 1, 24), it was confirmed that the warp was further controlled to be 50 μm or less.

It should be noted that when a thickness of the nitride layer was less than 4 μm (Sample 22), the withstand voltage was insufficient. When a thickness exceeded 10 μm (Sample 28), cracks were generated, and it was difficult to produce a HEMT element.

What is claimed is:

1. A nitride semiconductor substrate for a high withstand voltage power device in which a buffer layer and a semiconductor active layer each comprising a group 13 nitride are stacked one by one on one principal plane of a 6-inch Si single crystal substrate with a thickness of 600 to 1000 μm, and the total thickness of said buffer layer and said semiconductor active layer is 4 to 10 μm, wherein the buffer layer is one kind of layer consisting of a composite layer in which a pair of an AlN single crystal layer and a GaN single crystal layer are repeatedly stacked so that the AlN single crystal layer is formed in contact with the one principal plane of the Si single crystal substrate, and a further GaN single crystal layer is formed in contact with the top GaN layer of the composite layer, the one principal plane has an offset angle of 0.1° to 1° or −1° to −0.1° with respect to a (111) plane, an average dopant concentration in a bulk of the Si single crystal substrate is $1\times10^{18}$ to $1\times10^{21}$ cm$^{-3}$, said dopant is boron, and said Si single crystal substrate has a SiO$_2$ film with a thickness of 300 to 600 nm on the back which is a face opposite the one principal plane.

2. A nitride semiconductor substrate as claimed in claim 1, wherein said SiO$_2$ film is formed at a growth temperature of 400° C. to 600° C.

* * * * *